(12) United States Patent
Lips

(10) Patent No.: US 10,989,772 B2
(45) Date of Patent: Apr. 27, 2021

(54) TEM RESONATOR-TYPE RF ANTENNA DEVICE FOR A MAGNETIC RESONANCE IMAGING SYSTEM

(71) Applicant: KONINKLIJKE PHILIPS N.V., Eindhoven (NL)

(72) Inventor: Oliver Lips, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 1191 days.

(21) Appl. No.: 14/761,346

(22) PCT Filed: Dec. 30, 2013

(86) PCT No.: PCT/IB2013/061404
§ 371 (c)(1),
(2) Date: Jul. 16, 2015

(87) PCT Pub. No.: WO2014/111777
PCT Pub. Date: Jul. 24, 2014

(65) Prior Publication Data
US 2015/0362568 A1    Dec. 17, 2015

Related U.S. Application Data

(60) Provisional application No. 61/753,477, filed on Jan. 17, 2013.

(51) Int. Cl.
*G01V 3/00* (2006.01)
*G01R 33/345* (2006.01)
*G01R 33/34* (2006.01)
*G01R 33/385* (2006.01)

(52) U.S. Cl.
CPC ... *G01R 33/3453* (2013.01); *G01R 33/34092* (2013.01); *G01R 33/385* (2013.01)

(58) Field of Classification Search
CPC ............. G01R 33/5608; G01R 33/543; G01R 33/3815; G01R 33/30; A61B 5/055
(Continued)

(56) References Cited

U.S. PATENT DOCUMENTS 9,069,098 B2 * 6/2015 Hopper .................... G01V 3/32
9,081,070 B2 * 7/2015 Konijn ............... G01R 33/3875
(Continued)

FOREIGN PATENT DOCUMENTS

JP          04285535 A     10/1992
WO      2005111646 A1     11/2005
(Continued)

OTHER PUBLICATIONS

Vaughan et al, "Efficient High-Frequency Body Coil for High Field MRI", Magnetic Resonance in Medicine 52:p. 851-859 (2004).
(Continued)

*Primary Examiner* — Walter L Lindsay, Jr.
*Assistant Examiner* — Frederick Wenderoth

(57) ABSTRACT

A TEM RF antenna device (40) for a magnetic resonance MR imaging system (10), •the RF antenna device (40) comprising a plurality of rungs (44), and each rung (44) having at least one axial member (46) that in an operational state is substantially arranged parallel to the axial direction (38) wherein •the axial members (46) of the plurality of rungs (44) are arranged along an azimuthal direction (34) in a substantially equally spaced relationship about a center axis (42), and wherein •the at least one axial member (46) of each of the rungs (44) has two end regions (48, 50) and wherein •for at least two rungs (44', 44") of the plurality of rungs (44) that are adjacently arranged with regard to the azimuthal direction (34), each rung (44', 44") comprising at least one transversal member (52, 54) that is galvanically connected to one of the end regions (48, 50) of the axial
(Continued)

member (46) of that rung (44', 44") only, in the operational state, the at least one transversal members (52, 54) of the adjacent rungs (44', 44") are substantially arranged such that there exists at least one location on each of the transversal members (52, 54) of the two rungs (44', 44") that at least have substantially identical azimuthal coordinates, thereby reducing the RF field outside of the antenna device.

20 Claims, 6 Drawing Sheets

(58) Field of Classification Search
USPC .................. 324/300–322; 600/407–435; 382/128–131
See application file for complete search history.

(56) References Cited

U.S. PATENT DOCUMENTS

| | | | |
|---|---|---|---|
| 2003/0193380 A1* | 10/2003 | de Swiet | G01R 33/34046 333/219 |
| 2004/0155656 A1 | 8/2004 | Leussler | |
| 2010/0109667 A1 | 5/2010 | Leussler | |
| 2010/0253462 A1 | 10/2010 | Hardy et al. | |
| 2012/0098541 A1* | 4/2012 | Konijn | G01R 33/3875 324/322 |
| 2013/0063142 A1* | 3/2013 | Hopper | G01V 3/32 324/303 |
| 2015/0362568 A1* | 12/2015 | Lips | G01R 33/3453 324/322 |

FOREIGN PATENT DOCUMENTS

| | | |
|---|---|---|
| WO | 2010018535 A1 | 2/2010 |
| WO | 2013054235 A1 | 4/2013 |

OTHER PUBLICATIONS

Leussler et al, "U-Shaped Ladder TEM-Coil Structure With Truncated Sensitivity Profile" Proc. Intl, Soc. Mag. Reson. Med. 20, May 5, 2012 p. 2805.

\* cited by examiner

TEM RESONATOR-TYPE RF ANTENNA DEVICE FOR A MAGNETIC RESONANCE IMAGING SYSTEM

CROSS-REFERENCE TO PRIOR APPLICATIONS

This application is the U.S. National Phase application under 35 U.S.C. § 371 of International Application No. PCT/IB2013/061404, filed on Dec. 30, 2013, which claims the benefit of U.S. Patent Application No. PCT/IB2013/061404, filed on Jan. 17, 2013. These applications are hereby incorporated by reference herein.

FIELD OF THE INVENTION

The invention pertains to a radio frequency (RF) antenna device for applying an RF field to an examination space of a magnetic resonance (MR) imaging system, and an MR imaging system employing at least one such RF antenna device.

BACKGROUND OF THE INVENTION

In the art of magnetic resonance (MR) imaging, birdcage type coils are being employed as RF antennae, especially as body coils at higher magnetic field strength like, for instance, 3 T because of their superior power efficiency in comparison to transversal electromagnetic mode (TEM)-type resonators. This is mainly due to the ring currents, which confine the radio frequency (RF) field to a smaller region around the coil, whereas the RF field axially extends far outside the coil in case of TEM-type resonators. As an attempt of improvement, coils have been proposed which comprise U-shaped resonator elements (Leussler et al.: *U-shaped Ladder TEM-Coil Structure with Truncated Sensitivity Profile in z-Direction for High Field MRI*, ISMRM 20 (2012), 2805). These so called UTEM (U-shape TEM-type) coils emulate the function of the ring of a birdcage type coil by their transversal conductor elements and thus are also able to confine the RF field outside the coil.

It is desirable to be able to employ a TEM-type resonator for MR imaging, with its defined RF ground that can advantageous be made use of for de-tuning circuits, feeding cables and RF pick-up coils used for RF safety purposes, which also has a confined RF field.

SUMMARY OF THE INVENTION

It is therefore an object of the invention to provide a TEM-type RF antenna with an improved reduction of RF field outside the coil.

In one aspect of the present invention, the object is achieved by a radio frequency (RF) antenna device for a magnetic resonance (MR) imaging system having an examination space with a substantially static main magnetic field that defines an axial direction of the examination space, the RF antenna device comprising a plurality of rungs made from an electrically conductive material, each rung of the plurality of rungs having at least one axial member that in an operational state is substantially arranged parallel to the axial direction, wherein the axial members of the plurality of rungs are arranged along an azimuthal direction in a substantially equally spaced relationship about a center axis, and wherein the at least one axial member of each of the rungs has two end regions, and wherein for at least two rungs of the plurality of rungs that are adjacently arranged with regard to the azimuthal direction, each rung comprising at least one transversal member that is galvanically connected to one of the end regions of the axial member of that rung only, in the operational state, the at least one transversal members of the adjacent rungs are substantially arranged such that there exists at least one location on each of the transversal members of the two rungs that at least have substantially identical azimuthal coordinates.

As is known to the one skilled in the art, locations within the examination space of an MR imaging system are most often best described using cylindrical coordinates, due to the rotational symmetry about the axial direction of the main magnetic field, the z-axis of the cylindrical coordinate system is usually aligned with. In the operational state, the center axis of the RF antenna device coincides with the z-axis.

The phrase "azimuthally", as used in this application, shall be understood particularly as being aligned in the azimuthal direction about the z-axis of the cylindrical coordinate system.

The phrase "end region", as used in this application, shall be understood particularly as the region beginning at an end of the rung and reaching to one third, preferably to one fourth, and, most preferably, to one fifth of an extension length of the rung.

The phrase "transversal member", as used in this application, shall be understood particularly as a member that is aligned with regard to the axial member so as to form sides of an angle that differs from a right angle by less than of greater than 60°, preferably less than 45°, and, most preferably, less than 30°.

By that, the RF antenna device can be driven in a transverse electromagnetic mode (TEM) with an electrical current distribution similar to a ring current of a birdcage coil, without having any direct galvanic connection between the transverse members of adjacent rungs, but with a confining effect on the RF field of the RF antenna device. The phrase "direct galvanic connection" shall be understood particularly as a galvanic connection between the transverse members that does not include an additional connecting part which is distinct from the two transverse members.

As a beneficial side effect, an electromagnetic coupling between the adjacent rungs is increased, resulting in a boost of splitting of most resonant modes of the RF antenna device (i.e. the difference in frequency of two consecutive resonance frequencies increases with increased coupling), which is advantageous for a two-channel or quadrature mode of operation.

In another aspect of the present invention, the RF antenna device is provided to apply an RF field to the examination space for a resonant excitation of nuclei at a first time of operation, and for receiving magnetic resonance RF energy emitted by the nuclei at another time of operation that is different from the first time of operation. Thereby, a transmit/receive RF antenna with improved power sensitivity and signal-to-noise ratio can be achieved.

Preferably, the RF antenna device is provided to be operated as a transverse electromagnetic mode (TEM) resonator-type body coil, so that a field of view can be selected from any part of a human body that can be positioned within the RF antenna device.

In a preferred embodiment, the transversal members of each of the adjacently arranged rungs are substantially arranged such that the at least one location of the transversal members of the two rungs with substantially identical azimuthal coordinates also have substantially identical radial coordinates with regard to a center axis of the RF antenna device. By this, the rungs can be arranged in a manner that occupies little space in the radial direction, which is highly valuable in tube-like examination spaces.

In another preferred embodiment, the transversal members of each of the adjacently arranged rungs are substantially arranged such that the at least one location of the transversal members of the two rungs with substantially identical azimuthal coordinates also have substantially identical axial coordinates. Thereby, the rungs can be arranged in a manner that occupies little space in the axial direction, keeping an axial length of the RF antenna device short.

Preferably, a center line of at least one transversal member of a rung of the plurality of rungs that are adjacently arranged with regard to the azimuthal direction is a straight line in space. The phrase "center line", as used in this application, shall be understood particularly as a multitude of points representing the geometrical centers of potential cross-sections of the transversal member in planes perpendicular to a direction of extension. The straight line in space may comprise a radial component as well as an axial component (i.e. in z-direction). By that, the current distribution in the ring of a birdcage coil can be emulated in a constructively very easy manner.

The center line of at least one rung of the plurality of rungs that are adjacently arranged with regard to the azimuthal direction may comprise at least two substantially straight sections, wherein the two straight sections are arranged to form an obtuse angle. The angle formed by two straight lines in space may be determined by building the dot product of two normalized vectors in space representing the directions of the two straight lines. Thereby, a larger overlap of adjacently arranged rungs may be accomplished, resulting in a larger emulating current with an improved confinement of the RF field of the RF antenna device and a stronger electromagnetic coupling of the rungs.

An improved emulation of the ring current in a birdcage coil can be achieved if the center line of at least one of the transversal members is shaped as a curved line. This is especially true if the curved line is differentiable at all locations except for end points of the curved line. The curved line may comprise points of inflection for shimming purposes.

In a further preferred embodiment, the curved line substantially is a part of a circular arc. As a result, the contribution of electrical current in the rung to the RF field may be may be a close approximation to the current of a ring segment in a birdcage coil. A superposition of such electrical currents in the adjacently arranged rungs may result in an excellent emulation of the ring current in the birdcage coil.

It is another object of the invention to provide a magnetic resonance MR imaging system that comprises an examination space provided to position a subject of interest within, a main magnet for generating a substantially static magnetic field in the examination space, wherein the substantially static magnetic field is directed parallel to a center axis of the examination space, and at least one of the disclosed embodiments of an RF antenna device or combinations thereof.

BRIEF DESCRIPTION OF THE DRAWINGS

These and other aspects of the invention will be apparent from and elucidated with reference to the embodiments described hereinafter. Such embodiment does not necessarily represent the full scope of the invention, however, and reference is made therefore to the claims and herein for interpreting the scope of the invention.

In the drawings.

DETAILED DESCRIPTION OF EMBODIMENTS

This description contains several embodiments of the invention. The individual embodiments are described with reference to a particular figure or group of figures and are identified by a prefix number of the particular embodiment. Features whose function is the same or basically the same in all embodiments are identified by reference numbers made up of the prefix number of the embodiment to which it relates, followed by the number of the feature. If a feature of an embodiment is not described in the corresponding figure depiction, or a reference number mentioned in a figure depiction is not shown in the figure itself, reference should be made to the description of a preceding embodiment.

Figure 1:
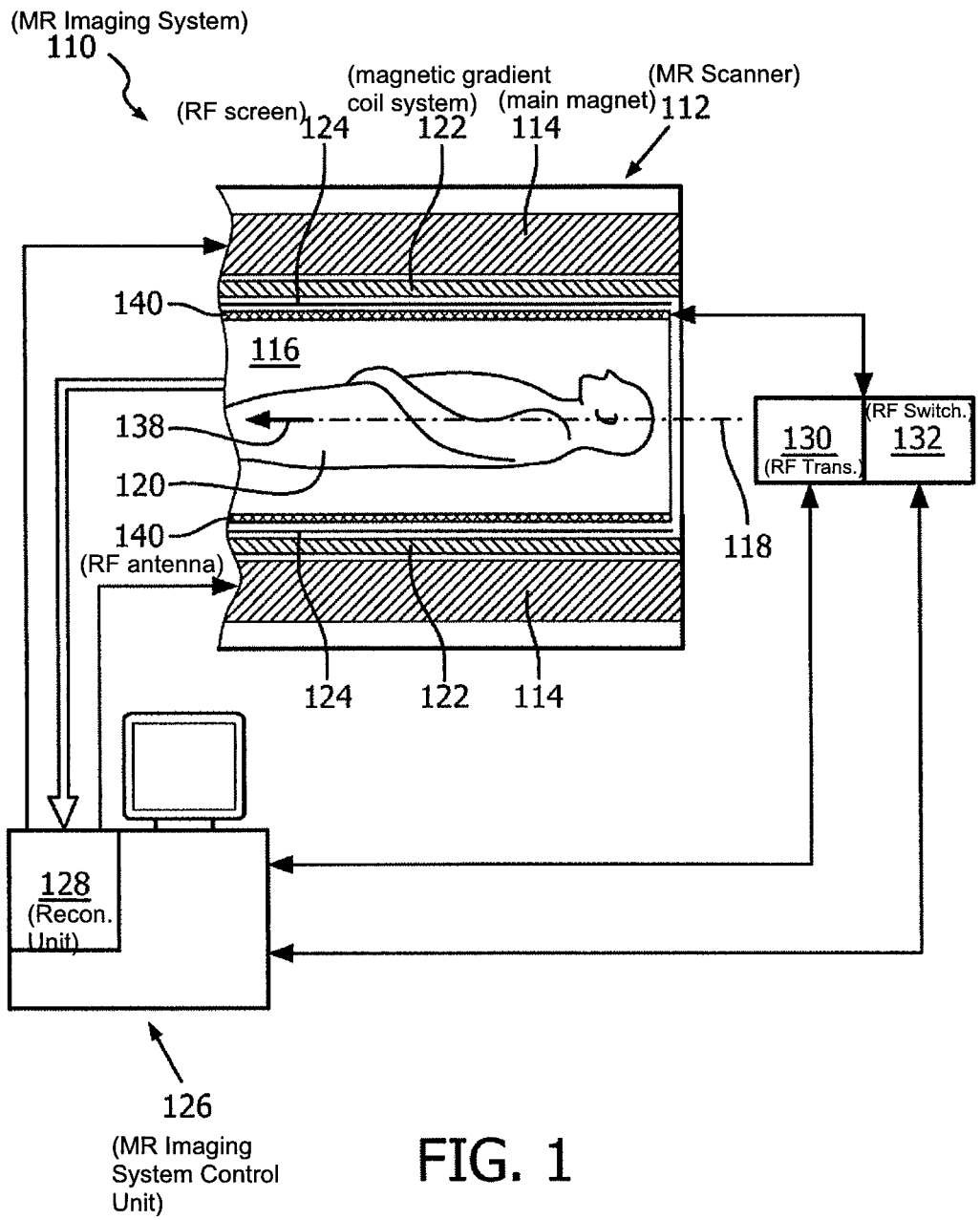
FIG. 1 is a schematic illustration of a part of an embodiment of an MR imaging system including a radio frequency (RF) antenna device in accordance with the invention.

FIG. 1 shows a schematic illustration of a part of an embodiment of a magnetic resonance (MR) imaging system 110 comprising an MR scanner 112. The MR imaging system 110 includes a main magnet 114 provided for generating a substantially static magnetic field. The main magnet 114 has a central bore that provides an examination space 116 around a center axis 118 for a subject of interest 120, usually a patient, to be positioned within. For clarity, a customary table for supporting the patient has been omitted in FIG. 1. The substantially static magnetic field defines an axial direction 138 of the examination space 116, aligned in parallel to the center axis 118. In principle, the invention is also applicable to any other type of MR imaging system providing an examination region within a static magnetic field. Further, the MR imaging system 110 comprises a magnetic gradient coil system 122 provided for generating gradient magnetic fields superimposed to the static magnetic field. The magnetic gradient coil system 122 is concentrically arranged within the bore of the main magnet 114, as is well known in the art.

Further, the MR imaging system 110 includes a radio frequency (RF) antenna device 140 designed as a whole-body coil that is provided for applying an RF magnetic field to the examination space 116 during RF transmit phases to excite nuclei of the subject of interest 120. The RF antenna device 140 is also provided to receive MR signals from the excited nuclei during RF receive phases. In an operational state of the MR imaging system 110, RF transmit phases and RF receive phases are taking place in a consecutive manner. The MR imaging system 110 comprises an MR imaging system control unit 126 provided to control functions of the MR scanner 112.

The RF antenna device 140 has a center axis 142 (FIG. 2) and, in the operational state, is arranged concentrically within the bore of the main magnet 114 such that the center axis 142 of the RF antenna device 140 and the center axis 118 of the MR imaging system 110 coincide. As is well known in the art, a cylindrical metal RF screen 124 is arranged concentrically between the magnetic gradient coil system 122 and the RF antenna device 140.

An RF transmitter unit 130 is provided to feed RF power of an MR radio frequency to the RF antenna device 140 via an RF switching unit 132 during the RF transmit phases. During RF receive phase, the RF switching unit 132 directs the MR signals from the RF antenna device 140 to an MR image reconstruction unit 128 residing in the MR imaging system control unit 126. This technique is well known to the one skilled in the art and thus does not need to be described in further detail herein.

Figure 2:
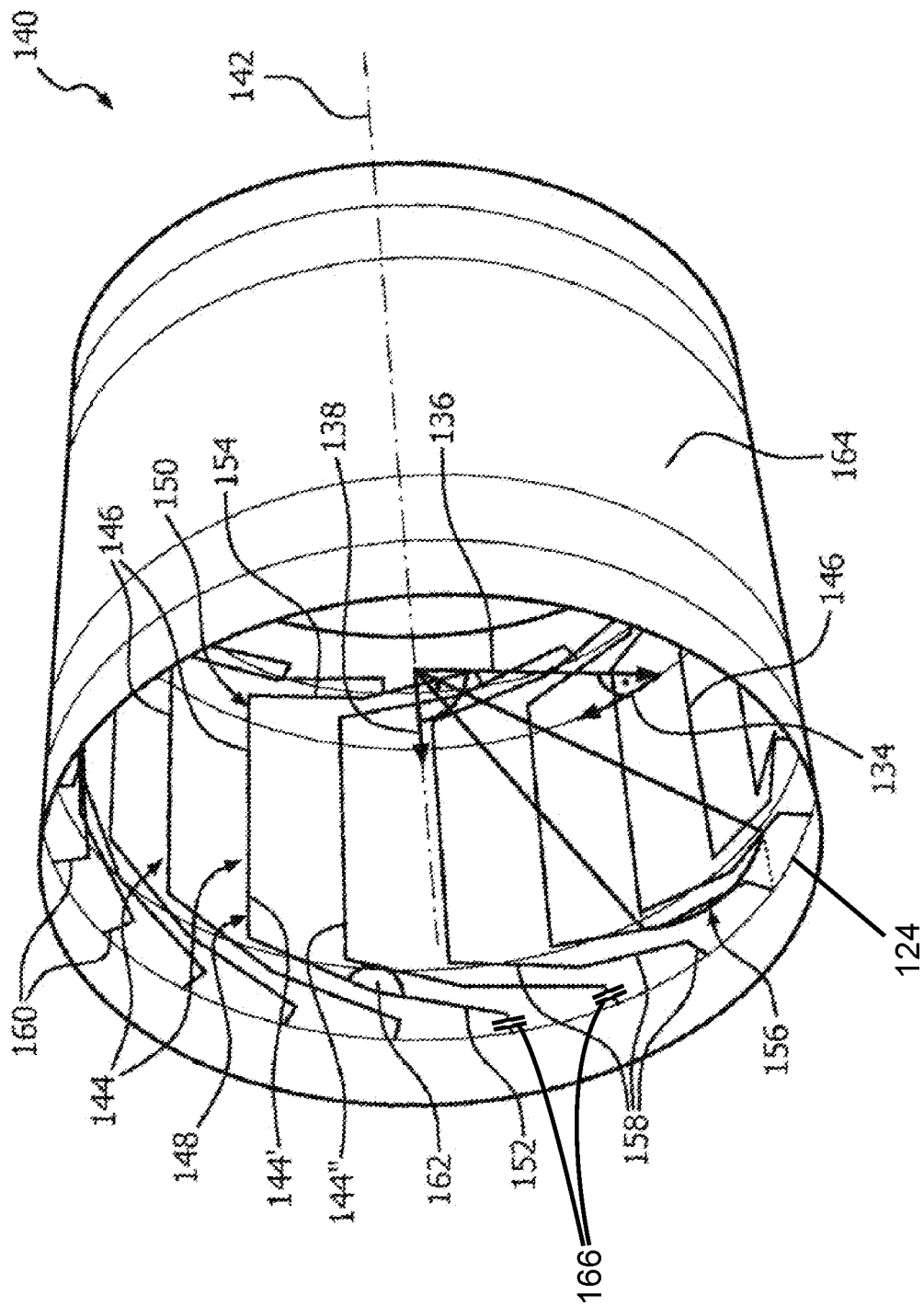
FIG. 2 is a 3-D view of the RF antenna device pursuant to the embodiment of FIG. 1.

FIG. 2 is a 3-D view of the RF antenna device 140 pursuant to the embodiment of FIG. 1. The RF antenna device 140 comprises a plurality of twenty rungs 144 made from an electrically conductive material such as copper. Each rung 144 of the plurality of rungs includes one axial member 146 that in an operational state is substantially arranged parallel to and also extends in the axial direction 138.

The rungs 144 are shown in FIG. 2 in a line-like manner. The rungs 144 may as well have a wider extension perpendicular to the direction of the center axis 142. In that case, the lines shown in FIG. 1 are understood to represent center lines of the rungs 144.

The axial members 146 of the plurality of twenty rungs 144 are arranged along an azimuthal direction 134 in a substantially equally spaced relationship about the center axis 142 of the RF antenna device 140.

The axial member 146 of each of the rungs 144 has two end regions 148, 150. Each of the rungs 144 comprises two transversal members 152, 154. One each of the two transversal members 152,154 is galvanically connected to one of the end regions 148, 150 of the axial member 146 of that rung 144 only. At each end region 148, 150 of each one of the rungs 144, the transversal member 152, 154 and the axial member 146 form two sides of an angle that differs from a right angle by less than 15°.

As is shown in FIG. 2, for each two rungs 144', 144" of the plurality of twenty rungs 144 that are adjacently arranged with regard to the azimuthal direction 134, in the operational state, the transversal members 152, 154 of the adjacent rungs 144', 144" are substantially arranged such that there exists a portion 156 of the transversal members 152, 154, and therewith in particular at least one location on each of the transversal members 152, 154 of the two rungs 144', 144", that at least have identical azimuthal coordinates. For illustration purposes, another way of describing the relative configuration of two adjacently arranged rungs 144', 144" in a more qualitative way is that they "partially overlap" when looked at in the axial direction 138 and/or radial direction 136.

In the embodiment of the RF antenna device 140 of FIG. 2, the transversal members 152, 154 of the adjacent rungs 144', 144" are substantially arranged such that, besides the existing portions 156 of the transversal members 152, 154 having identical azimuthal coordinates, the portions 156 also have identical radial coordinates, which describe the distance of a location to the center axis 118 of the examination space 116 in the radial direction 136 when the RF antenna device 140 is installed and in the operational state.

Each of the transversal members 152, 154 of the rungs 144 of the plurality of twenty rungs 144 has a center line that comprises three straight sections 158 which are straight lines in space, and are arranged in a plane that is tangential to a lateral surface 164 of a virtual circular cylinder whose cylinder axis coincides with the center axis 142 of the RF antenna device 140, and whose radius is identical to the radial coordinate of the rungs 144. Two straight sections 158 of each of the transversal members 152, 154 that are directly and galvanically connected to each other are arranged to form an obtuse angle 162. At a distal end 160 with regard to the axial member 146 of the rung 144, each of the transversal members 152, 154 is connected to the RF screen 124 via a capacitor 166 (only two of which are shown in FIG. 2 for illustrative purposes).

The RF antenna device 140 of FIG. 2 is provided to be operated as a transverse electromagnetic mode (TEM) resonator-type body coil. Capacitors may be placed at all of the rungs 144 in order to tune the RF antenna device 140 to desired resonances, as well as to achieve an intended distribution of an electric field. An RF feeding of the RF antenna device 140 may be realized in a capacitive manner against the RF screen 124, as well as inductively. These techniques and embodiments are similar to that known to the one skilled in the art from standard TEM resonator-type coils.

Magnetic fields from currents flowing in the transversal member 152, 154 of the rungs 144 effectively add up to emulate a magnetic field generated by a ring current of a birdcage-type body coil, which results in a reduction of the RF field outside the RF antenna device 140, as will be described later on.

Figure 3:
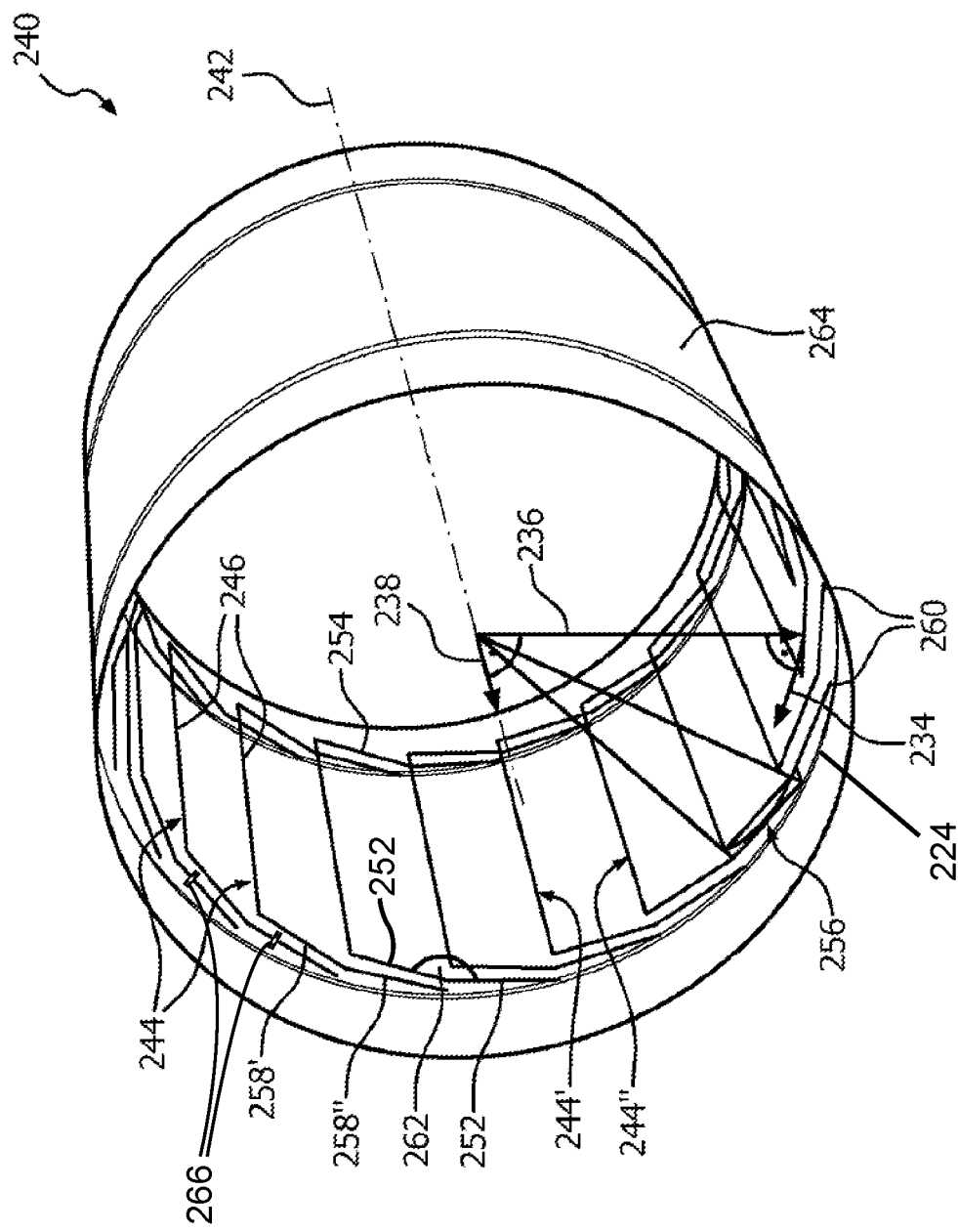
FIG. 3 is a 3D-view of an alternative embodiment of an RF antenna device in accordance with the invention.

FIG. 3 is a 3D-view of an alternative embodiment of an RF antenna device 240 in accordance with the invention, comprising a plurality of twenty rungs 244. Here, transversal members 252, 254 of azimuthally adjacent rungs 244', 244" are substantially arranged such that, besides existing portions 256 of the transversal members 252, 254 having identical azimuthal coordinates, the portions 256 also have identical axial coordinates, which describe a position along a center axis 242 of the RF antenna device 240.

Each of the transversal members 252, 254 of the rungs 244 of a plurality of twenty rungs 244 has a center line that comprises two straight sections 258',258" which are straight lines in space, and are arranged in a plane that is perpendicular to the center axis 242 of the RF antenna device 240. The two straight sections 258',258" of each of the transversal members 252, 254 that are directly and galvanically connected to each other are arranged to form an obtuse angle 262. At a distal end 260 with regard to the axial member 246 of the rung 244 they are galvanically connected to, each one of the transversal members 252, 254 is connected to the RF screen 224 via a capacitor 266 (only two of which are shown in FIG. 3 for illustrative purposes). From FIG. 2 it becomes obvious that an electromagnetic coupling between two adjacent rungs 244',244" may be much larger than for conventional TEM-type resonators. This results in an advantageous boost of a splitting of frequencies of resonant modes of the RF antenna device 240.

The transversal members 252, 254 of the rungs 244 of this RF antenna device 240 can be looked at as if a first straight section 258' was tilted about the axial member 246 by a first angle, and as if a second straight section 258" was tilted about a hinge connection between the first section 258' and the second straight section 258" by a second angle. From this appearance, and from the U-like shape of the rungs 244, the RF antenna devices 40 in accordance with the invention may be referred to as being of a tilted U-shaped TEM (tUTEM) type-resonator design.

Figure 4:
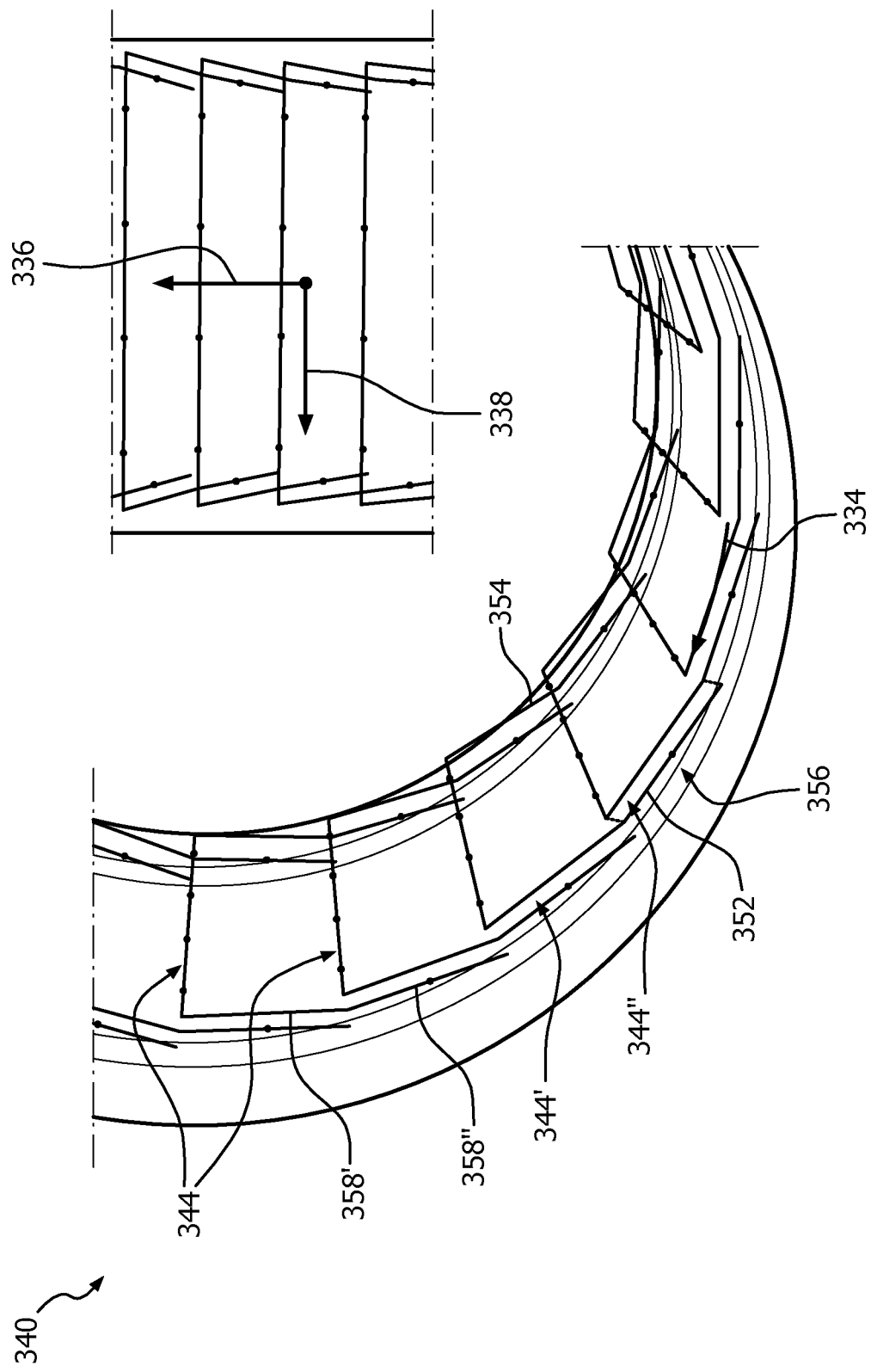
FIG. 4 is a 3D-view of yet another alternative embodiment of an RF antenna device in accordance with the invention.

FIG. 4 is a 3D-view of yet another alternative embodiment of an RF antenna device 340 in accordance with the invention, wherein two straight sections 358', 358" of transversal members 352, 354 of rungs 344 of a plurality of rungs 344 are arranged such that for each two rungs 344', 344" of the plurality of twenty rungs 344 that are adjacently arranged with regard to an azimuthal direction 334, in an operational state, the transversal members 352, 354 of the adjacent rungs 344', 344" are arranged such that there exist portions 356 of the transversal members 352, 354 that have identical azimuthal coordinates only, and different axial and radial coordinates.

In another embodiment of an RF antenna device in accordance with the invention, rungs of the RF antenna device may have transversal members with a center line which is shaped as a curved line and differentiable at all locations except for end points of the curved line, and in particular is shaped like a part of a circular arc. Each of the transversal members may lie in a lateral surface of a virtual circular cylinder with a center axis coinciding with a center axis of the RF antenna device. The advantage of such RF antenna devices lies in a particularly smooth RF field distribution.

Figure 5:
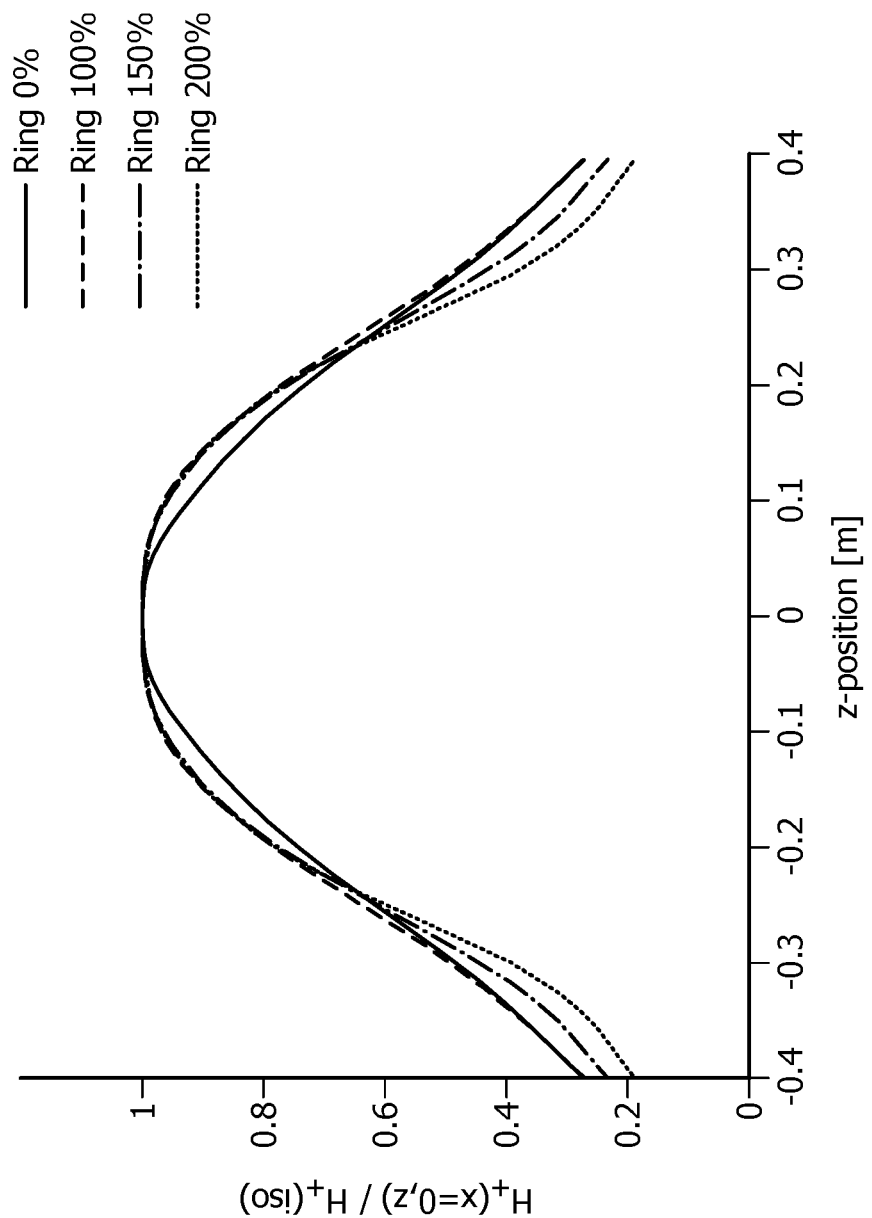
FIG. 5 illustrates simulated RF field distributions for various RF antenna devices in accordance with the invention compared to a conventional one.

FIG. 5 illustrates simulated RF field distributions for various RF antenna devices in accordance with the invention compared to a conventional one. Shown on the ordinate is an amplitude of the RF magnetic field H1+ along a center axis 42 of the RF antenna devices 40 for an unloaded condition (empty RF antenna device 40). In the legend, a parameter "ring percentage" indicates the above described azimuthal "overlap", i.e. how far a transversal member 52, 54 of one rung 44' reaches in a direction of an azimuthally adjacently arranged rung 44", 100% meaning that the transversal member 52, 54 of one rung 44' reaches right up to the adjacent rung 44", so that there exists just one location on each of the transversal members 52, 54 of two adjacent rungs 44', 44" that at least have identical azimuthal coordinates. For the conventional TEM-type resonator body coil, this parameter equals 0%, and for the U-shaped resonator elements suggested in [1] the parameter is limited to 100%. The advantages of the RF antenna devices 40 in accordance with the invention are obvious from the reduced RF field strength outside the RF antenna device 40 as shown in FIG. 5 for parameters 150% and 200%.

Figure 6:
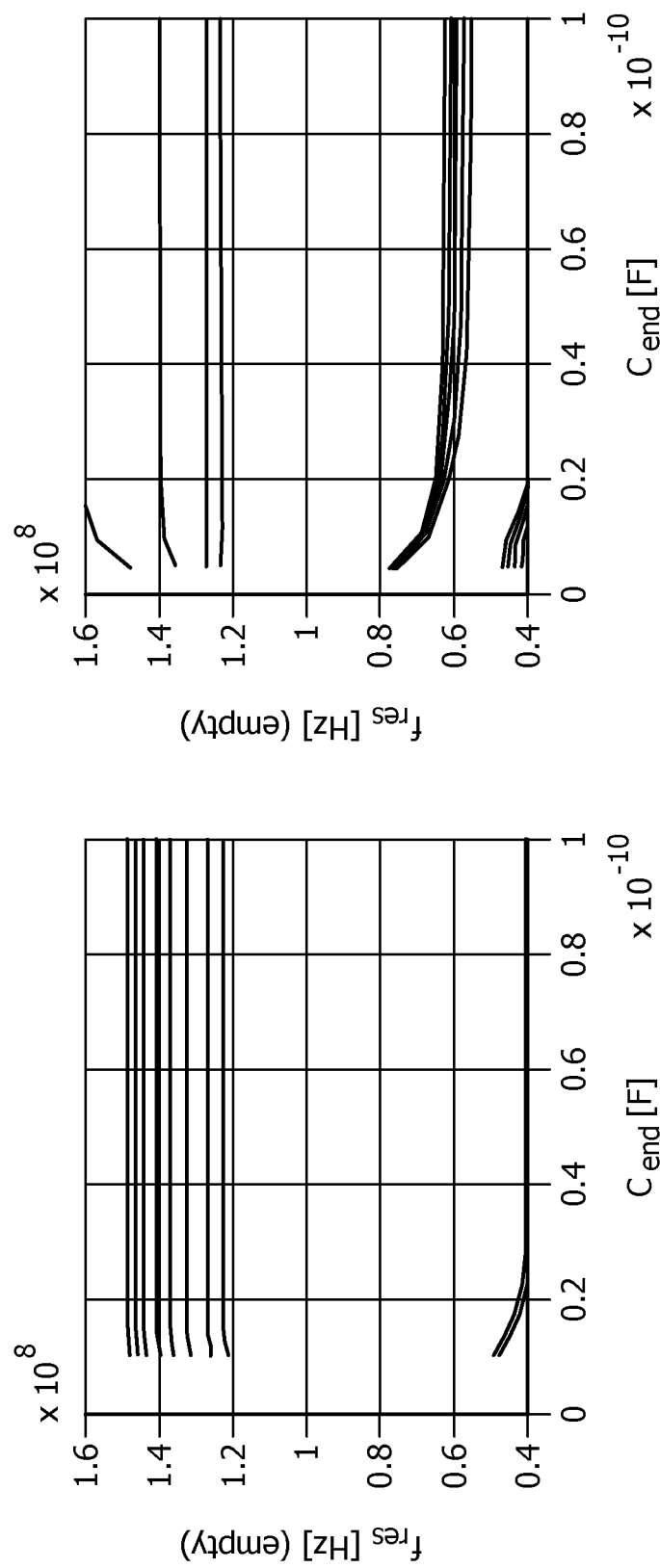
FIG. 6 illustrates a resonance spectrum of an RF antenna devices in accordance with the invention compared to a resonance spectrum of a conventional one.

FIG. 6 illustrates the beneficial side effect of stronger electromagnetic coupling between the rungs 44 of RF antenna devices 40 in accordance with the invention. On the right hand side of FIG. 6 are shown resonant mode frequencies $f_{res}$ of an RF antenna device 40 rungs accordance with the invention, comprising rungs 44 with transversal members 52, 54 that extend up to the second next adjacent rung 44 (i.e. the ring parameter equals 200%), in comparison to a resonant mode frequency spectrum of a conventional TEM-type resonator, which is shown on the left hand side of FIG. 6. Both the RF antenna devices are tuned to a resonant frequency of 128 MHz as a function of the capacitance connecting the rung to an RF screen 24, with four fixed capacitors of 30 pF each placed in the rung. As shown, the strong coupling causes a significant shift of most of the other unused and undesired resonant mode frequencies $f_{res}$ away from the intended resonant frequency of 128 MHz.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A transverse electromagnetic mode radio frequency antenna device for a magnetic resonance imaging system wherein the magnetic imaging system comprises an examination space with a substantially static main magnetic field that defines an axial direction of the examination space wherein the axial direction is described using cylindrical coordinates, the transverse electromagnetic mode radio frequency antenna device comprising:
  a plurality of rungs made from an electrically conductive material;
  a cylindrical radio frequency (RF) screen disposed around the plurality of rungs;
  wherein each rung of the plurality of rungs has at least one axial member that in an operational state is substantially arranged parallel to the axial direction;
  wherein the axial members of the plurality of rungs are arranged along an azimuthal direction in a substantially equally spaced relationship about a center axis;
  wherein the at least one axial member of each of the rungs has two end regions;
  wherein for at least two rungs of the plurality of rungs that are adjacently arranged with regard to the azimuthal direction, each rung comprising:
    at least one transversal member with regard to the axial member that is galvanically connected to one of the end regions of the axial member of that rung only; and
    a capacitor connecting the at least one transversal member to the RF screen; and
  wherein in the operational state, the at least one transversal members of the adjacent rungs are substantially arranged such that there exists at least one location on each of the transversal members of the two rungs that at least have substantially identical azimuthal coordinates.

2. The transverse electromagnetic mode radio frequency antenna device as claimed in claim 1, provided to apply a radio frequency field to the examination space for a resonant excitation of nuclei at a first time of operation, and for receiving magnetic resonance radio frequency energy emitted by the nuclei at another time of operation that is different from the first time of operation.

3. The transverse electromagnetic mode radio frequency antenna device as claimed in claim 1, provided to be operated as a transverse electromagnetic mode resonator-type body coil.

4. The transverse electromagnetic mode radio frequency antenna device as claimed in claim 1, wherein the transversal members of each of the adjacently arranged rungs are substantially arranged such that the at least one location of the transversal members of the two rungs with substantially identical azimuthal coordinates also have substantially identical radial coordinates with regard to a center axis of the radio frequency antenna device.

5. The transverse electromagnetic mode radio frequency antenna device as claimed in claim 1, wherein the transversal members of each of the adjacently arranged rungs are substantially arranged such that the at least one location of the transversal members of the two rungs with substantially identical azimuthal coordinates also have substantially identical axial coordinates.

6. The transverse electromagnetic mode radio frequency antenna device as claimed in claim 1, wherein a center line of at least one transversal member of a rung of the plurality of rungs that are adjacently arranged with regard to the azimuthal direction is a straight line in space.

7. The transverse electromagnetic mode radio frequency antenna device as claimed in claim 1, wherein the center line of at least one rung of the plurality of rungs that are adjacently arranged with regard to the azimuthal direction comprises at least two substantially straight sections, wherein the two straight sections are arranged to form an obtuse angle.

8. The transverse electromagnetic mode radio frequency antenna device as claimed in claim 1, wherein the center line of at least one of the transversal members is shaped as a curved line which is differentiable at all locations except for end points of the curved line.

9. The transverse electromagnetic mode radio frequency antenna device as claimed in claim 8, wherein the curved line substantially is a part of a circular arc.

10. A magnetic resonance imaging system, comprising:
an examination space provided to position a subject of interest within a magnet, wherein the magnet generates a substantially static magnetic field in the examination space;
wherein the substantially static magnetic field is directed parallel to a center axis of the examination space; and
at least one transverse electromagnetic mode radio frequency antenna device the transverse electromagnetic mode radio frequency antenna device comprising:
a plurality of rungs made from an electrically conductive material and
a cylindrical radio frequency (RF) screen disposed around the plurality of rungs;
wherein each rung of the plurality of rungs has at least one axial member that in an operational state is substantially arranged parallel to the axial direction;
wherein the axial members of the plurality of rungs are arranged along an azimuthal direction in a substantially equally spaced relationship about a center axis;
wherein the at least one axial member of each of the rungs has two end regions;
wherein for at least two rungs of the plurality of rungs that are adjacently arranged with regard to the azimuthal direction, each rung comprising at least one transversal member with regard to the axial member that is galvanically connected to one of the end regions of the axial member of that rung only and that is connected to the RF screen via a capacitor; and
wherein in the operational state, the at least one transversal members of the adjacent rungs are substantially arranged such that there exists at least one location on each of the transversal members of the two rungs that at least have substantially identical azimuthal coordinates.

11. The magnetic resonance imaging system of claim 10, wherein the at least one transverse electromagnetic mode radio frequency antenna device is configured to:
apply a radio frequency field to the examination space for a resonant excitation of nuclei at a first time of operation; and
receive magnetic resonance radio frequency energy emitted by the nuclei at another time of operation that is different from the first time of operation.

12. The magnetic resonance imaging system of claim 10, wherein the at least one transverse electromagnetic mode radio frequency antenna device is configured as a transverse electromagnetic mode resonator-type body coil.

13. The magnetic resonance imaging system of claim 10, wherein the transversal members of each of the adjacently arranged rungs are substantially arranged such that the at least one location of the transversal members of the two rungs with substantially identical azimuthal coordinates also have substantially identical radial coordinates with regard to a center axis of the radiofrequency antenna device.

14. The magnetic resonance imaging system of claim 10, wherein the transversal members of each of the adjacently arranged rungs are substantially arranged such that the at least one location of the transversal members of the two rungs with substantially identical azimuthal coordinates also have substantially identical axial coordinates.

15. The magnetic resonance imaging system of claim 10, wherein a center line of at least one transversal member of a rung of the plurality of rungs that are adjacently arranged with regard to the azimuthal direction is a straight line in space.

16. The magnetic resonance imaging system of claim 10, wherein the center line of at least one rung of the plurality of rungs that are adjacently arranged with regard to the azimuthal direction comprises at least two substantially straight sections, wherein the two straight sections are arranged to form an obtuse angle.

17. The magnetic resonance imaging system of claim 10, wherein the center line of at least one of the transversal members is shaped as a curved line which is differentiable at all locations except for end points of the curved line.

18. The magnetic resonance imaging system of claim 17, wherein the curved line substantially is a part of a circular arc.

19. A transverse electromagnetic mode radio frequency antenna device for a magnetic resonance imaging system comprising an examination space with a substantially static main magnetic field that defines an axial direction of the examination space wherein the axial direction is described using cylindrical coordinates, the transverse electromagnetic mode radio frequency antenna device comprising:
a plurality of rungs made from an electrically conductive material and
a cylindrical radio frequency (RF) screen disposed around the plurality of rungs;
wherein each rung of the plurality of rungs having:
at least one axial member that, in an operational state, is substantially arranged parallel to the axial direction, the axial members of the plurality of rungs being arranged along an azimuthal direction in a substantially equally spaced relationship about a center axis, the at least one axial member of each of the rungs has two end regions; and
for at least two rungs of the plurality of rungs that are adjacently arranged with regard to the azimuthal direction, at least one transversal member with regard to the axial member galvanically connected to one of the end regions of the axial member of that rung only via a capacitor,
wherein, in the operational state, the at least one transversal members of the adjacent rungs are substantially arranged such that there exists at least one location on each of the transversal members of the two rungs that at least have substantially identical azimuthal coordinates.

20. The transverse electromagnetic mode radio frequency antenna device as claimed in claim 19, wherein the transversal members of each of the adjacently arranged rungs are substantially arranged such that the at least one location of the transversal members of the two rungs with substantially identical azimuthal coordinates also have substantially identical radial coordinates with regard to a center axis of the radio frequency antenna device.

* * * * *